United States Patent [19]
Oshikawa

[11] Patent Number: 4,841,264
[45] Date of Patent: Jun. 20, 1989

[54] LADDER-TYPE CERAMIC FILTER

[75] Inventor: Michitaka Oshikawa, Tsurugashima, Japan

[73] Assignee: Toko Kabushiki Kaisha, Tokyo, Japan

[21] Appl. No.: 224,499

[22] Filed: Jul. 19, 1988

[51] Int. Cl.$^4$ ............................................... H03H 9/58
[52] U.S. Cl. ..................................... 333/189; 333/190
[58] Field of Search ................ 333/187, 188, 189–190, 333/191, 192; 310/342, 366, 367

[56] References Cited

U.S. PATENT DOCUMENTS

| | | | |
|---|---|---|---|
| 1,795,204 | 3/1931 | Espenschied | 333/189 |
| 1,921,035 | 9/1931 | Mason | 333/190 |
| 4,651,109 | 3/1987 | Inoue | 333/189 X |

Primary Examiner—Marvin L. Nussbaum
Attorney, Agent, or Firm—Stevens, Davis, Miller & Mosher

[57] ABSTRACT

A ladder-type ceramic filter is formed of a plurality of series and parallel resonators arranged in series and in parallel between the input and output terminals. In this filter, a series resonator on the side of the input terminal has a resonant frequency lower than those of other series resonators and an antiresonant frequency higher than those of other series resonators. Further, a parallel resonator on the side of the output terminal has a resonant frequency lower than those of other parallel resonators and an antiresonant frequency higher than those of other parallel resonators.

2 Claims, 2 Drawing Sheets

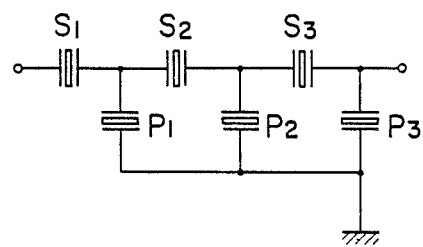
F I G. 1
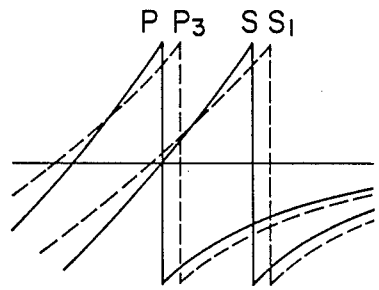
F I G. 3

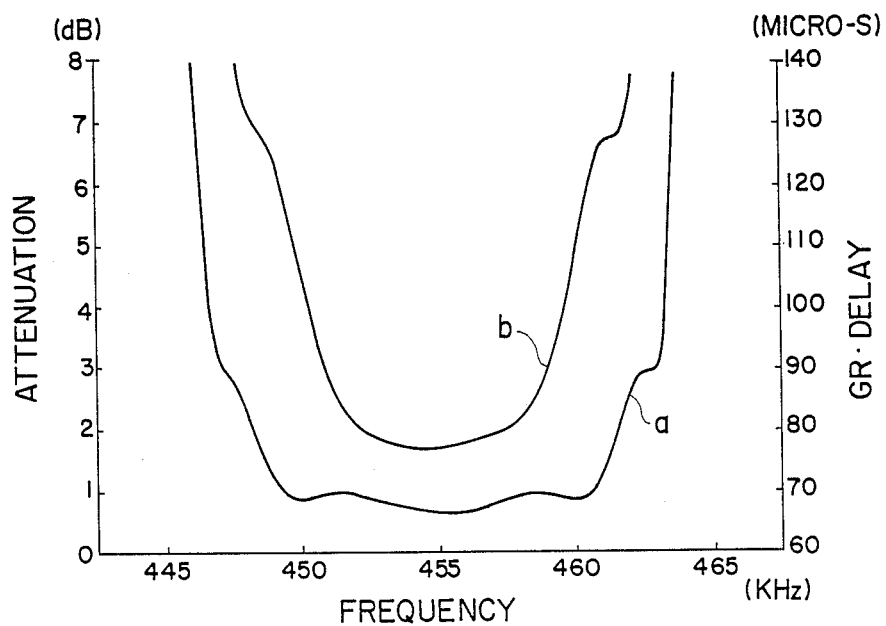
F I G. 5

LADDER-TYPE CERAMIC FILTER

BACKGROUND OF THE INVENTION

1. Applied Field in Industry

This invention relates to the structure of a ladder-type ceramic filter, and more particularly to a ladder-type ceramic filter in which piezoelectric ceramic resonators having different characteristics are arranged.

2. Prior Art and the Problems Therewith

Various ladder-type ceramic filters are known having a high selectivity filter characteristic in which a plurality of piezoelectric ceramic resonators are connected in the form of a ladder.

Such ladder-type ceramic filters are constituted by arranging a plurality of resonators connected in series and a plurality of ones connected in parallel between the input and output terminals.

In general, for series and parallel resonators, there are employed resonators having resonant frequencies equal to each other and antiresonant frequencies equal to each other, respectively. In this instance, the respective differences $\Delta F$ between the resonant and antiresonant frequencies of the resonators are fixed.

For example, for three series resonators, the resonant and antiresonant frequencies are set equal to 455 and 471 KHz, respectively, thus allowing the difference therebetween to be equal to 16 KHz. In addition, for three parallel resonators, a setting is made such that the resonant and antiresonant frequencies are equal to 439 and 455 KHz, respectively, thus allowing the difference therebetween to be equal to 16 KHz which is the same value as the difference for the three series resonators. These resonators thus set are used.

The filter characteristic a and the group delay characteristic b of the ladder-type ceramic filter constructed as described above are shown in FIG. 4. It is apparent from this figure that the filter characteristic a has a high ripple and great undulation. In recent years, a distortion factor and a group delay characteristic have become problems to be considered. The undulation of the waveform is a main cause of deterioration of such characteristics.

The characteristic of the resonators mentioned above is shown in FIG. 2 in terms of a reactance curve. As seen from this figure, the waveforms between the resonant frequency $F_1$ and the antiresonant frequency $F_2$ of the parallel resonator and between the resonant frequency $F_2$ and the antiresonant frequency $F_3$ of the series resonator are not compensated. This provides a cause of the occurrence of ripple.

As just described above, using resonators having uniform characteristics provides the merit that particular consideration is not taken for the arrangement of resonators, but is questionable to much extent in view of characteristics.

SUMMARY OF THE INVENTION

Objects

An object of this invention is to solve the above-mentioned problems, thus to provide a ladder-type ceramic filter having small undulations and excellent characteristics.

Another object is to provide a ladder-type ceramic filter in which both group delay characteristic and distortion factor are excellent by the realization of the ladder-type ceramic filter featured above.

Means for Solving the Problems

This invention contemplates attaining the above-mentioned objects by changing the characteristics of resonators at the input and output stages of respective resonators constituting a ladder-type ceramic filter.

Particularly, this invention is directed to a ladder-type ceramic filter to attain the above-mentioned objects by allowing both the resonant and antiresonant frequencies of the resonators at the input and output stages to be different from those of other resonators.

Namely, there is provided a ladder-type ceramic filter comprising an input terminal, an output terminal and a plurality of sections connected between the input terminal and the output terminal, each section comprising a series resonance element and a parallel resonance element, the resonance frequency of a series resonance element provided in a section located closest to the input terminal being lower than the resonance frequency of series resonance elements provided in other sections, the antiresonance frequency of the series resonance element provided in the section located closest to the input terminal being higher than that of the series resonance elements provided in other sections, the resonance frequency of a parallel resonance element provided in a section located closest to the output terminal being lower than that of parallel resonance elements provided in other sections, and the antiresonance frequency of the parallel resonance element provided in the section located closest to the output terminal being higher than that of parallel resonance elements provided in other sections.

BRIEF DESCRIPTION OF THE DRAWINGS

In the accompanying drawings:

FIG. 1; is a circuit diagram showing an embodiment according to this invention;

FIG. 3 is a reactance characteristic curve of a ladder-type ceramic filter according to this invention;

FIG. 5 is a characteristic curve showing the filter characteristic a and the group delay characteristic b of a filter according to this invention.

DESCRIPTION OF THE PREFERRED EMBODIMENT

A preferred embodiment of this invention will be described with reference to the attached drawings.

FIG. 1 is a circuit diagram showing the connection arrangement of resonators employed in the embodiment according to this invention. This arrangement is composed of three series resonators $S_1$, $S_2$ and $S_3$ serially connected in order recited from the side of the input terminal, and three parallel resonators $P_1$, $P_2$ and $P_3$ parallelly connected in order recited also from the side of the input terminal. $S_1$ and $P_1$ forms a first section, $S_2$ and $P_2$ form a second section, while $S_3$ and $P_3$ form a third section.

The resonant and antiresonant frequencies of all the resonators are not the same, but they are set as follows:

|    | Resonant Frequency | Antiresonant Frequency | ΔF |
|----|---|---|----|
| $S_1$ | 453 | 477 | 24 |
| $P_1$ | 440 | 455 | 15 |
| $S_2$ | 455 | 470 | 15 |
| $P_2$ | 440 | 455 | 15 |
| $S_3$ | 455 | 470 | 15 |
| $P_3$ | 433 | 457 | 24 |

(In frequency of KHz)

The series resonance elements $S_1$ provided in a section located at the input end and the parallel resonance element $P_3$ provided in a section located at the output end are so constructed that the difference between the resonance frequency and the antiresonance frequency of these elements is selected to be 24 KHz, while the difference between the resonance frequency and the antiresonance frequency of the other resonance element $S_2$, $S_3$, $P_1$ and $P_2$ is selected to be 15 KHz. More specifically, the resonance frequency of the series resonance element $S_1$ is made lower than that of other series resonance elements $S_2$ and $S_3$, while the antiresonance frequency of the element $S_1$ is made higher than that of other series resonance elements $S_2$ and $S_3$. Likewise, the resonance frequency of the parallel resonance element $P_3$ is made lower than the resonance frequencies of the parallel resonance elements $P_1$ and $P_2$ while the antiresonance frequency of the element $P_3$ is made higher than the antiresonance frequencies of the parallel resonance elements $P_1$ and $P_2$.

The reactance curve of the ladder-type ceramic filter in which the series and parallel resonators are arranged as stated above is shown in FIG. 3.

Figure 2:
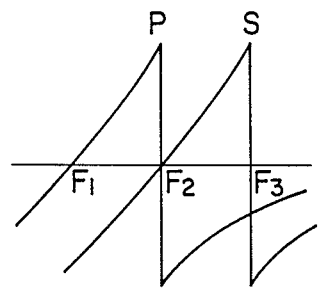
FIG. 2 is a reactance characteristic curve of a conventional ladder-type ceramic filter.

As apparent from this figure, the characteristic $S_1$ of the series resonator on the side of the input terminal and the characteristic $P_3$ of the parallel resonator on the side of the output terminal are superimposed on the characteristic S of the series resonator and the characteristic P of the parallel resonator shown in Fig. 2. This results in a suppression of ripple waveforms.

In this way, the filter characteristic of the ladder-type ceramic filter according to this invention is such that ripple is minimized over the entire pass band as indicated by a in FIG. 5.

Figure 4:
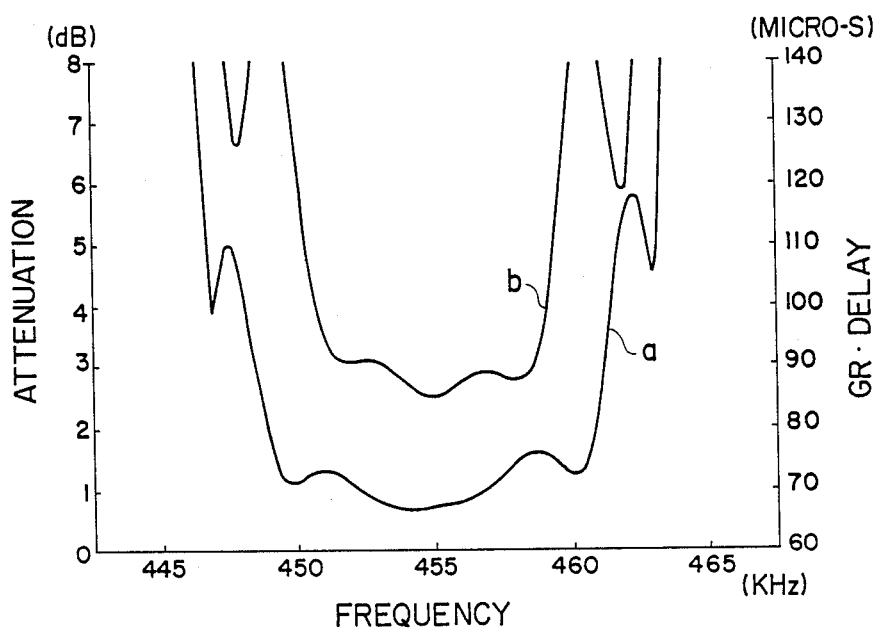
FIG. 4 is a characteristic curve showing the filter characteristic a and the group delay characteristic b of a conventional filter.

Thus, the group delay characteristic b of the filter is improved. Namely, the group delay characteristic in the prior art has undulations and poles as indicated by b in FIG. 4, whereas the group delay characteristic in the embodiment according to this invention becomes smooth as indicated by b in FIG. 5. Thus, it has been observed that the group delay characteristic is considerably improved. There are ladder-type ceramic filters comprising an odd number of resonators and ones comprising an even number of resonators. This invention may be applied to a ladder-type ceramic filter in which series and parallel resonators of which number is four or more in total are connected.

In this invention, the setting is made such that the resonant and antiresonant frequencies of other series resonators except for one on the side of the input terminal are nearly equal to each other, respectively, and that the resonant and antiresonant frequencies of other parallel resonators except for one of the side of the output terminal are nearly equal to each other, respectively.

Advantages with the Invention

In accordance with this invention, ripple in the pass band is reduced to much extent. Thus, a ladder-type ceramic filter having an excellent frequency response is provided.

By the realization of such a ladder-type ceramic filter, the group delay characteristic and the distortion factor are improved to a great extent.

In addition, a ladder-type ceramic filter having less waveform change with respect to frequency changes of resonators is provided.

What is claimed is:

1. A ladder type piezoelectric ceramic filter comprising an input terminal, an output terminal and a plurality of resonator sections connected between said input terminal and said output terminal, each section comprising a series resonance element and a parallel resonance element, the resonance frequency of a series resonance element provided in a section located closest to said input terminal being lower than the resonance frequency of series resonance elements provided in other sections, the antiresonance frequency of the series resonance element provided in said section located closest to said input terminal being higher than that of said series resonance elements provided in other sections, the resonance frequency of a parallel resonance element provided in a section located closest to said output terminal being lower than that of parallel resonance elements provided in other sections, and the antiresonance frequency of said parallel resonance element provided in said section located closest to said output terminal being higher than that of parallel resonance elements provided in other sections.

2. A ladder type piezoelectric ceramic filter according to claim 1 comprising at least three of said sections and wherein all of the series resonance elements provided in the sections other than that located in said section located closest to said input terminal are provided with equal resonance frequencies and equal antiresonance frequencies, while all of the parallel resonance elements provided in said sections, other than that located in said section located closest to said output terminal are provided with equal resonance frequencies and equal antiresonance frequencies.

* * * * *